(12) United States Patent
Arelakis et al.

(10) Patent No.: US 9,330,001 B2
(45) Date of Patent: May 3, 2016

(54) CACHE SYSTEM AND A METHOD OF OPERATING A CACHE MEMORY

(71) Applicants: Angelos Arelakis, Göteborg (SE); Per Stenström, Torslanda (SE)

(72) Inventors: Angelos Arelakis, Göteborg (SE); Per Stenström, Torslanda (SE)

(73) Assignee: ZEROPOINT TECHNOLOGIES AB, Göteborg (SE)

( * ) Notice: Subject to any disclaimer, the term of this patent is extended or adjusted under 35 U.S.C. 154(b) by 224 days.

(21) Appl. No.: 13/897,385

(22) Filed: May 18, 2013

(65) Prior Publication Data

US 2013/0311722 A1 Nov. 21, 2013

Related U.S. Application Data

(60) Provisional application No. 61/649,378, filed on May 21, 2012.

(51) Int. Cl.
*G06F 12/08* (2006.01)
*H03M 7/40* (2006.01)
*H03M 7/30* (2006.01)

(52) U.S. Cl.
CPC ........ *G06F 12/0811* (2013.01); *G06F 12/0886* (2013.01); *G06F 12/0897* (2013.01); *H03M 7/40* (2013.01); *H03M 7/6058* (2013.01); *G06F 2212/401* (2013.01)

(58) Field of Classification Search
CPC ..................................................... H03M 7/40
See application file for complete search history.

(56) References Cited

U.S. PATENT DOCUMENTS

| | | | |
|---|---|---|---|
| 6,657,569 B2 | 12/2003 | Barnett | |
| 7,412,564 B2 | 8/2008 | Wood et al. | |
| 7,642,935 B2 | 1/2010 | Chang | |
| 2009/0077109 A1* | 3/2009 | Paris | G06F 12/0864 |
| 2012/0262314 A1* | 10/2012 | Carlson | H03M 7/3084 341/87 |
| 2013/0031337 A1* | 1/2013 | Larin et al. | G06F 9/3853 712/226 |

OTHER PUBLICATIONS

A. R. Alameldeen et al., Adaptive cache compression for high-performance processors, Proceedings of Int. Symp. on Computer Architecture, 2004.
S. Y. Larin, Exploiting program redundancy to improve performance, cost and power consumption in embedded systems, Ph.D. dissertation, 2000.
Y. Zhang et al., Frequent value locality and value-centric data cache design, Proceedings of Int. Conf. on Architectural Support for Programming Languages and Operating Systems, 2000.

* cited by examiner

*Primary Examiner* — Kevin Verbrugge
*Assistant Examiner* — Zubair Ahmed
(74) *Attorney, Agent, or Firm* — Renner, Otto, Boisselle & Sklar, LLP.

(57) ABSTRACT

In one embodiment, a computer cache is extended with structures that can (1) establish the frequency by which distinct values occur in the cache and use that information to (2) compress values in caches into dense codes using a plurality of statistical-based compression techniques and (3) decompress densely coded values to realize caches that can store information densely that can be retrieved with low overhead.

27 Claims, 3 Drawing Sheets

CACHE SYSTEM AND A METHOD OF OPERATING A CACHE MEMORY

CROSS-REFERENCE TO RELATED APPLICATIONS

This application claims priority to U.S. Provisional Application No. 61/649,378, Systems, methods, and mechanisms for value-centric memory systems, filed May 21, 2012, which is incorporated by reference herein in its entirety.

TECHNICAL FIELD

This subject matter generally relates to the field of memory systems in electronic computers and to the field of lossless data compression.

BACKGROUND

A computer system comprises one or a plurality of processors, a computer memory system, and an I/O system. Any of the plurality of processors can execute instructions of which some instructions can do arithmetic/logic operations, some can do branches and yet other instructions can access a computer memory system. Instructions that access a computer memory can load data from said computer memory at a particular location—load instructions—and store data in computer memory at a particular location—store instructions. To load data from a particular location, a load instruction comprises a location identifier (sometimes called memory address) that designates the location in the computer memory from which the data value is loaded. Analogously, to store data in a particular location in computer memory, a store instruction comprises a location identifier that designates in which location in the computer memory the data value accompanying the store instruction is stored.

A computer memory comprises a linear array of memory locations that each comprises a memory word that can be 32 bits wide although other widths are possible. In a computer system employing a single level of computer memory, the plurality of processors connected to that single level of memory can all access and modify the value in any memory location by issuing a location identifier and can perform load and store instructions as explained above. Since the number of locations that is needed by computer tasks can be large, say several billions of memory locations, using a single level of memory may result in a slow access to each memory location. For that reason computer systems may use multiple levels of memory such that the number of memory locations that can be hosted in a level closer to one or a plurality of processors is typically fewer and can be accessed faster compared to a level further away from one or a plurality of processors.

Concretely, and by way of example, in a two-level memory system all memory locations that a computer program may need to access can be stored at the level furthest away from the processor—level 2—and the level closest to one or a plurality of processors—level 1—can contain at any time a subset of the ones at level 2. Typically, when a processor issues a load or a store instruction the level 1 memory is first accessed. First when a copy of the accessed memory location is not available at that level, the next level (level 2) is accessed which in this example can deliver the data value. It is well known for someone skilled in the art that such a two-level memory system can be generalized to any number of levels. There are many other possibilities in prior art to manage a two, or in general an n-level memory system. For example, a level may comprise a cache connected to each of one or a plurality of processors, whereas a next level comprises a cache shared by a plurality of processors.

In general, an arbitrary level of computer memory comprises a number of memory locations that can be accessed by the plurality of processors that it serves. A certain memory location can be accessed in that level of memory by having a processor issuing a location identifier (or memory address) to said level. That level of computer memory can use a hash function to access one of the locations in the linear array of memory locations. We refer to this conventional way of organizing a computer memory location-wise as a location-centric computer memory.

For the sake of discussion, let us assume that N distinct memory locations accessed by a processor contain the same value. Then in a location-centric computer memory the same value may occupy N locations and the redundancy in data values is N. If one could store a distinct value in a single location regardless of how many memory locations contain that same value, one could make use of memory resources more efficiently.

In the field of loss-less data compression, techniques exist that can store redundant values in computer memory more efficiently than in a conventional location-centric memory. For example, in dictionary-based compression techniques, all values stored in the locations in a computer memory are encoded in a dictionary and the encoding for the value stored in a particular location is stored in that location instead of the real value. Assuming that a computer memory stores N-bit words, it encodes as many as $2^N$ distinct values. If $2^M$ distinct values are stored in the computer memory, where M<N, one encoding of these $2^M$ values would occupy only M bits instead of N bits. In the value-centric cache design (Zhang, 2000), a select set of distinct values is predetermined in an off-line profiling pass to encode frequently used redundant values densely. Since the predetermined set is limited, the compression achieved is also limited as values that are redundant but not members of the frequently used value set will use N bits rather than M.

In the well known Huffman compression algorithm substantially denser encodings can be found by taking advantage of the fact that some values are more common than others. The basic idea of Huffman coding is that given a set of symbols (an alphabet), symbols are assigned to variable-length codes according to their frequency of occurrence. A symbol can act as a reference to a value. And therefore, instead of representing all values with codes of the same width, narrower codes can be assigned to more frequent values, while wider codes to less frequent ones, thus decreasing the total size of a specific sequence of values that normally form a cache line or a memory line or even a memory page substantially. Huffman coding can assign codes to the values according to a specific binary tree, which is constructed bottom-up and left-to-right according to the frequency of occurrence of the symbols or their probabilities. The tree can be binary, meaning two nodes per parent node, quaternary, or in general N-ary depending on how many child nodes each parent node has. The structure of the tree, however, determines the depth, and is an important consideration for the processing.

In the following, by way of example and without loss of generality, we consider Huffman coding as an exemplary approach in the field of data compression using statistical-based compression in which the frequency of values is first established after which the coding used for compression is determined. There are three Huffman coding schemes known from prior art. First, in the static coding scheme the coding is created once at the beginning based on preprocessing of the frequencies of the values. Second, the semi-adaptive coding scheme does the coding in two passes. In the first pass, it calculates the probabilities, while in the second pass it constructs the coding and then compresses the object. Third, in the fully adaptive coding scheme the Huffman tree and therefore its coding is modified dynamically during compression. Using static Huffman coding, the compressibility is expected to be low unless the same values are used with the same frequency distribution during the whole execution of a task. The semi-adaptive Huffman coding scheme is simpler than the fully adaptive one but new values cannot be coded and therefore cannot be immediately compressed, thus requiring the Huffman tree and therefore the coding to be re-built. Rebuilding the coding can possibly impact the compressibility during the slack between the two tree constructions. On the other hand, fully adaptive Huffman coding is typically modified continuously, thus changing the codes of the values. However, it requires the to-be-compressed data to be accessed sequentially to be able to construct a de-compressor that is a mirror of the compressor. Using the fully adaptive scheme to compress data in storage/memory hierarchies can be less attractive due to the processing overhead in changing the codes continuously.

Let us now consider the specific application of statistical-based compression techniques to the field of computer memory systems. A way to apply statistical-based compression techniques to store redundant values denser in a location-centric computer memory is to create a dictionary of the encodings of the values in the computer memory in a first step. Then, in a second step, encode all values in the locations of the computer memory using the dictionary entries in a similar way as in other dictionary-based compression techniques.

Huffman-based compression of memory content has been used to compress computer instructions stored in memory (Larin, 2000) using the aforementioned static coding. The static approach yields a limited compressibility for data that tend to change during execution and there are many problems in applying compression techniques in general and statistical-based compression techniques in particular to store redundant data values in computer memory densely.

A first family of problems is the potential overhead encountered in accessing the computer memory. Assuming first that all encodings are of a fixed size, say M bits, as in (Zhang, 2000) and (Alameldeen, 2004; U.S. Pat. No. 7,412,564) a dictionary must be queried to translate a compressed word to an uncompressed value. This can make the access slower than in a location-centric memory. In the case encodings are allowed to have different sizes, such as in Huffman coding, locations in computer memory may also have different sizes which may complicate the mapping of location identifiers to "encoded locations" and can further make the access slower. (U.S. Pat. Nos. 7,642,935; 6,657,569) discloses apparatuses that can decode Huffman codes. However, the decoding operation may impose delays and overhead concerning power and real-estate area which may not make them applicable to computer memory systems.

A second family of problems pertains to the use of statistical-based compression techniques and in particular the overhead involved in using semi-adaptive schemes for computer memory data. How to collect statistics on data value frequency of occurrence accessed in computer memory on-line, as programs are being executed, change the encodings under execution and keep it off of the critical access path are problems that prior art have not addressed satisfactory.

In summary, statistical-based compression techniques known from prior art can suffer from significant overheads in the processes of collecting statistics, accessing or modifying values in the field of computer memories. While they can store redundant values densely, they can cause access overheads making them inapplicable as a means to more effective use of computer memory resources.

SUMMARY

The invention disclosed in this document comprises a cache system and methods for operating a cache. Disclosed system can be used to store data words in a compact form. This can allow computer memories taking the form of disks, main memories or individual caches in a hierarchy to store more data than what is possible in conventional storage/memory hierarchies. In one embodiment, a conventional cache has a tag store and a data store and there is a one-to-one mapping between a tag entry and a data entry. By contrast, in a cache that utilizes the disclosed compression/decompression scheme, there is a many-to-one mapping between the reference and the value space, meaning that a value is associated with many memory locations. This association is then encoded using, for example, Huffman coding by assigning variable-length codewords based on the frequency of occurrence of every single value. While statistical-based compression techniques, such as Huffman coding, have been used in prior art in other applications, they are in general too slow to make them useful in computer memory/storage hierarchies, where a short access time is desirable. The disclosed systems and methods allow data values to be retrieved with a low access time overhead both regarding coding of values as well as their decoding. Alternatively, the disclosed invention can store data values compactly to envision computer memories that consume less energy or dissipate less power. In yet other applications, the size of computer memory can be constrained by form factor requirements and the disclosed invention can reduce the size of computer memories. All these advantages are achieved by a number of techniques that can be combined or applied in isolation which are disclosed in this patent application.

DETAILED TECHNICAL DESCRIPTION

Figure 1:
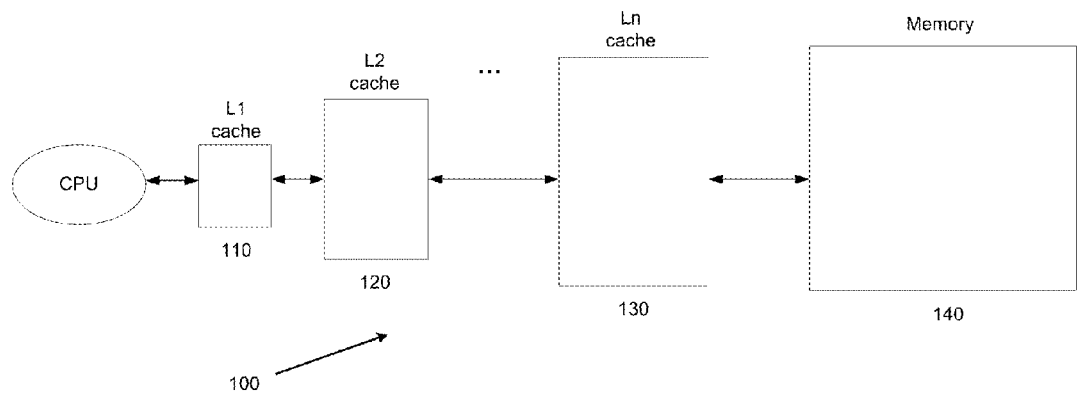
FIG. 1 depicts a block diagram of a computer system that comprises a CPU, a cache hierarchy comprising n levels and a main memory.

An embodiment of a computer system 100 is depicted in FIG. 1. This system comprises one or several processing units and a memory hierarchy. The processing unit comprises a processor, sometimes called CPU or core. The memory hierarchy, on the other hand, comprises several cache levels 110, 120 and 130 and a main memory 140, which can contain several levels as well (e.g., DRAM only, or DRAM and PCM). The number of cache levels varies and the current embodiment 100 depicts n levels: L1 110, an L2 120 up to an n-th level Ln 130 that are connected using some kind of interconnection means (e.g. bus or any other interconnection network). Alternative embodiments realize one or a plurality of CPUs along with a respective number of one or a plurality of private caches and other shared cache levels. An alternative example embodiment can contain 2 processors with 10 CPUs each where every single CPU can be connected to a private L1 and L2 cache, and all of the CPUs can share an L3 level cache while the two processors may share the main memory. Regarding the inclusion of the data in the cache hierarchy, any embodiment is possible and can be appreciated by someone skilled in the art. Finally, a computer system runs one or more tasks. A task can be any software application or part of it that can run on the particular system.

Figure 2:
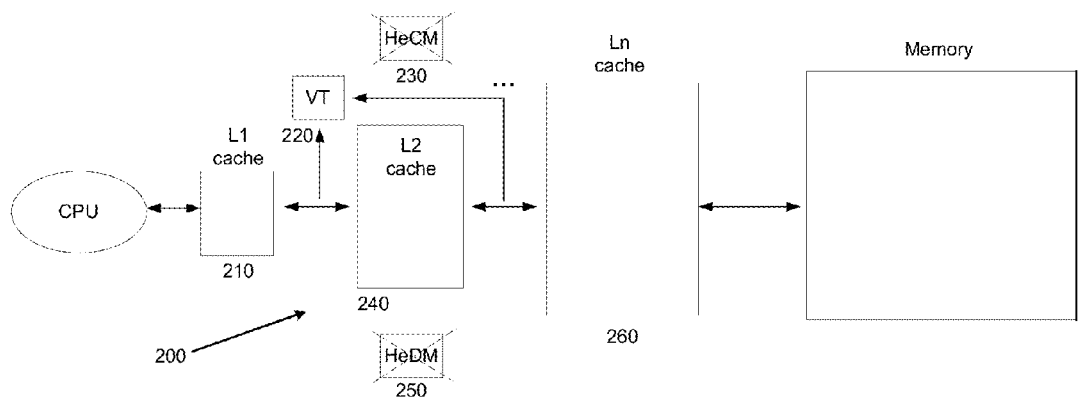
FIG. 2 depicts a block diagram of the computer system of FIG. 1 where a cache level (for example in this embodiment level 2—L2) is turned into a value-centric cache that is extended with a Huffman-based compression/decompression scheme. This value-centric cache is in the "training phase". Having the value-centric cache in the "training phase" means that every time the value-centric cache is accessed, the accessed values are tracked inside the Value Table (VT) to update their frequency of occurrence so that if the controller decides that compression is needed, the Huffman tree and the coding can be built.
Figure 3:
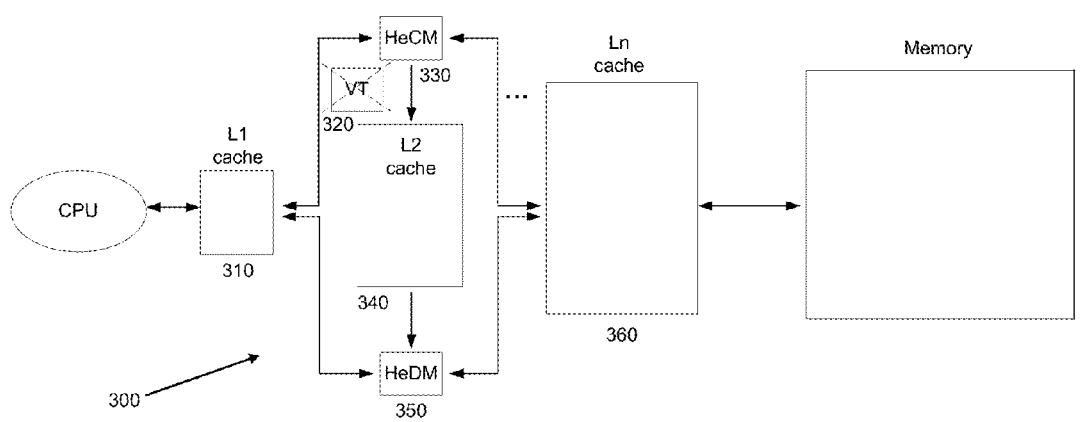
FIG. 3 depicts the block diagram of the computer system of FIG. 1, where a cache level (for example in this embodiment level 2—L2) is turned into a value-centric cache that is extended with a Huffman-based compression/decompression scheme, and this value-centric cache is in the "compression phase". Having the value-centric cache in the "compression phase" means that the value-centric cache is not accessed straightly, but through the compression mechanism (HeCM) 330 when a cache line is to be modified and, therefore, compressed, and through the decompression mechanism (HeDM) 350 when a cache line is read and therefore need to be decompressed. The content of a VT has been deactivated and its state is "frozen" in the state it was at code construction time.

FIG. 2 And FIG. 3 depict the embodiments 200 and 300, respectively, of a computer system that is the same embodiment of FIG. 1 but a location-centric cache has been replaced by a value-centric cache along with a compression/decompression mechanism disclosed in this patent application. Embodiments 200 and 300 show the system in two operation phases respectively: "training phase" and "compression phase". Both embodiments 200 and 300 of FIG. 2 and FIG. 3, respectively, depict without loss of generality, that the L2 cache (240 and 340) is a value-centric cache using the compression/decompression mechanisms disclosed in this patent application. However, someone skilled in the art should realize that every cache level could be value-centric and be extended by the compression/decompression mechanisms. In fact, embodiments where the disclosed compression/decompression mechanism is used at any level including the storage can also be derived from the detailed description of the disclosed embodiment. The compression and decompression mechanism can be activated in a dynamic way when a controller decides that more effective cache capacity is needed and deactivated when a controller decides that the benefit of the extra effective cache capacity is overrun by the time overhead due to the decompression of the compressed data. During the "training phase" the system is trained and the coding is constructed while the compression and decompression mechanisms are deactivated. On the other hand, during the "compression phase" the compression and decompression mechanism are activated and working using the coding produced by a previous "training phase".

FIG. 2 depicts the embodiment 200 of a computer system of FIG. 1 where the L2 cache 240 is extended with the compression/decompression mechanism, which consists of the Value Table (VT) 220, the Huffman-based Compression Mechanism (HeCM) 230 and the Huffman-based Decompression Mechanism (HeDM) 250. The embodiment 200 is in the "training phase" and both the compression mechanism 230 and the decompression mechanism 250 are deactivated (marked with an X). The Value Table (VT) 220 stores the values in the L2 cache and their frequency of occurrence by one or a plurality of entries, where each entry comprises the value and a counter. The L2 cache 240 still communicates with the L1 cache 210 and the Ln cache 260 (neighboring caches of the L2 cache 240) of the cache hierarchy but the VT is accessed as well. There are three fundamental operations in the L2 cache 240 which trigger an access to the Value Table:

Miss: Search the Value Table for the all the values in the requested block and increment the counters corresponding to said values. If a value is not in VT 220, it is added by possibly replacing another one. Any replacement algorithm can be assumed in the embodiment of the VT in the patent disclosure, for example, replacing the value with the least counter value.

Write: Decrement the VT counter(s) associated with the one or a plurality of values to be modified and increment the VT counter(s) associated with the one or a plurality of newly written values. If an entry for the newly written value does not exist, replacement of an existing value in the VT may have to be carried out.

Eviction: Decrement the VT counters associated with the evicted values of the cache line.

When the controller decides that the VT data can generate efficient codes that provide effective compression code construction is performed. When the coding is done, the operation phase can switch to the "compression phase". As a criterion to launch compression, one can count the number of misses. The controller could decide to start code generation when the number of misses corresponds to the number of blocks that can be hosted in a cache.

FIG. 3 depicts the embodiment 300 of the computer system of FIG. 2 that operates in the "compression phase". In that phase, the Huffman-based Compression Mechanism (HeCM) 330 and the Huffman-based Decompression Mechanism (HeDM) 350 are now activated while the Value Table (VT) 320 is deactivated meaning that its content is fixed. Another difference in contrast to the previous embodiment of FIG. 2 is that the L2 cache 340 is not directly connected to its neighboring caches in the cache hierarchy but via the HeCM 330 and HeDM 350 because the L2 cache 340 stores only compressed data. For example, if a cache line that is evicted from the L1 cache 310 is stored in the L2 cache, assuming an exclusive L2 cache from the L1, the line must be first compressed before it is inserted into the compressed L2 cache. HeCM performs this. On the other hand, if an L1 cache 310 requests data that exist in the compressed L2 cache 340, said data is decompressed by the HeDM 350 before being transferred to the L1 cache.

Figure 4:
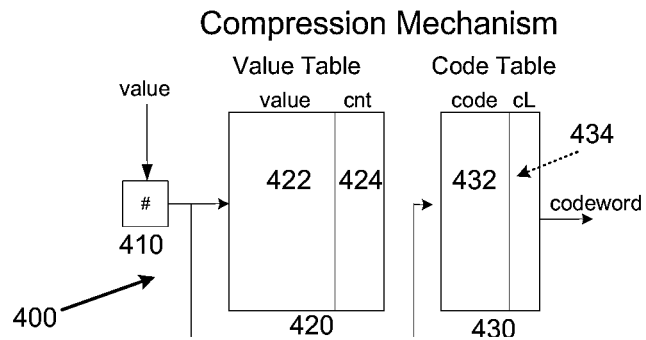
FIG. 4 depicts the block diagram of the compression mechanism that consists of the Value Table 420 and the Code Table 430. The Value Table 420 saves the values and their frequency of occurrence while the Code Table 430 saves the generated codewords. The cL field 434 saves the actual length of every codeword since Huffman coding generates variable-length codes.

FIG. 4 depicts an embodiment 400 of a Huffman enhanced Compression Mechanism HeCM. Unlike the previous embodiments 200 and 300 where VT 220 and 320 are depicted outside the HeCM 230 and 330, the embodiment of HeCM 400 contains a Value Table (VT) 420. The VT 420 saves the values 422 and their frequency of occurrence using the counter 424. HeCM 400 comprises a Code Table (CT) 430 which stores the generated codewords. In fact the VT is part of the compression mechanism 400 because both VT 420 and CT 430 are indexed using the address association mechanism 410 that is input by the value, and the VT 420 verifies that a particular value exists in the VT and therefore a valid codeword exists in the Code Table. The association function in the association mechanism 410 can be implemented as a hash function but someone skilled in the art may consider alternative implementations. As it is previously stated, during the "training phase", only the VT operates and can be updated, while during the "compression phase" the VT remains unchanged since the code has been generated, and the Code Table, which comprises the generated codewords, is the one that operates only.

VT 420 needs to contain a counter for every stored value to track the frequency of occurrence of every value. The counter width can affect the accuracy of the counter, which determines the frequency of occurrence, thus the position of the value in the Huffman tree and consequently the final coding. The counter width is determined by the maximum number of the values appeared in the cache. A cache of size X Bytes has X/4 words or X/4 values assuming that each value occupies say 32 bits (4 bytes). The maximum counter width that can capture X/4 instances of one value is thus defined by $c = \log_2(X/4) = \log_2(X) - 2$ bits. For instance, a 512-KB cache or memory structure contains a maximum of 131,072 32-bit values resulting in a maximum counter width of 17 bits to accommodate the case when all locations have the same value. In other embodiments, one can choose fewer bits per counter. Regardless, to normalize counters when a counter saturates, the content of all VT counters can be divided with two. In the VT of the compression/decompression mechanism disclosed in this patent application, in one embodiment one can assume the maximum counter width based on the cache size, i.e., 17 bits for a 512-KB cache. However, someone skilled in the art should realize how to adapt the above formula to alternative value granularities.

The Code Table (CT) 430 contains the generated Huffman codewords 432. Since the codewords have variable lengths, the length of each code-word, which is saved in cL 434, need to be known. The cL width must be bounded based on the maximum code-word length but this can only be determined by the height of the constructed Huffman tree. The height of the Huffman tree is based on the probability distribution and can vary. It can be even N−1, where N is the number of values in the VT, in the rare event when the value probabilities follow the Fibonacci sequence, while ideally Huffman coding achieves entropy when the value probabilities are negative powers of 2. Alternatively, the maximum codeword length can be bounded to a selected value at design time by for example profiling several applications and tracking the probability distribution of data values.

During the "compression phase", when a cache line is about to enter the value-centric cache, in which a conventional cache is extended with the compression/decompression mechanism disclosed in this patent application, all the cache words are compressed by replacing their values with the respective codeword. Each value enters the address association mechanism 410, and then the VT is accessed, using the output of mechanism 410 to verify that this value exists in the VT. If it exists then the Code Table 430 is accessed and provides the codeword. The accessed codeword replaces the value. If the value is not found in the VT, the uncompressed value is stored along with a unique code before it. At the end, the compressed words are concatenated into a compressed cache line, which is placed in the cache by the controller. A cache line is saved uncompressed in the cache to avoid data expansion in scenarios it makes no sense to compress them, for example when too few values of a cache line are found in the VT. The code, which is attached to an uncompressed value, can be fixed or created using the Huffman algorithm as well. For instance, a fair way of encoding all the infrequent values is to calculate the frequency of occurrence of all these values that are not in the VT at code construction time as one symbol and include it in the tree and code construction.

Figure 5:
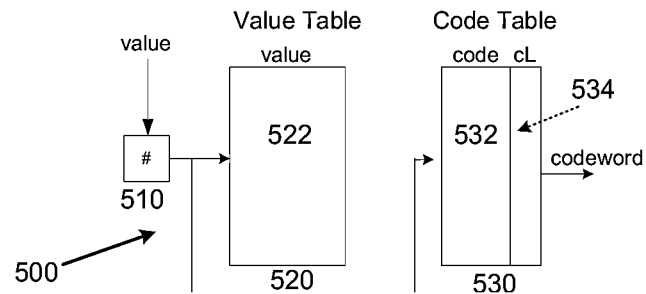
FIG. 5 depicts the block diagram of an alternative embodiment of the compression mechanism of FIG. 4. The cnt field is omitted because the counter cnt 424 and the code 532 have exactly the same width while only one of them is used in every phase: The cnt during the "training phase" and the code during the "compression phase'". This embodiment of the compression mechanism can be also considered as a cache where the value plays the role of the tag since if the value is found, then the Code Table is accessed during the "training phase" to update the counter, and during the "compression phase" to fetch the valid codeword.

FIG. 5 depicts an alternative embodiment 500 of 400 of FIG. 4, where the VT, without the cnt field, and the CT are merged into one structure. The difference between 500 and 400 is that there is no cnt field in the embodiment 500, such as the cnt 424 in embodiment 400. This can work because in fact the VT is not updated during the "compression phase" and the code is not used during the "training phase", and both code 532 and cnt 424 have the same width (d' and 'c' widths respectively are the same). Therefore, the embodiment 500 can be used instead resulting in a smaller area overhead. The code field 532 of the Code Table 530 stores the counters cnt during the "training phase" and the generated codewords during the "compression phase". Embodiments 420 and 500 can be designed in the same way as a cache. For instance, the value field 422 or 522 can be considered as a tag when accessing the VT, while the associativity can vary since the bigger the associativity, the smaller the probability of evicting a frequent value because it conflicts with another value.

Figure 6:
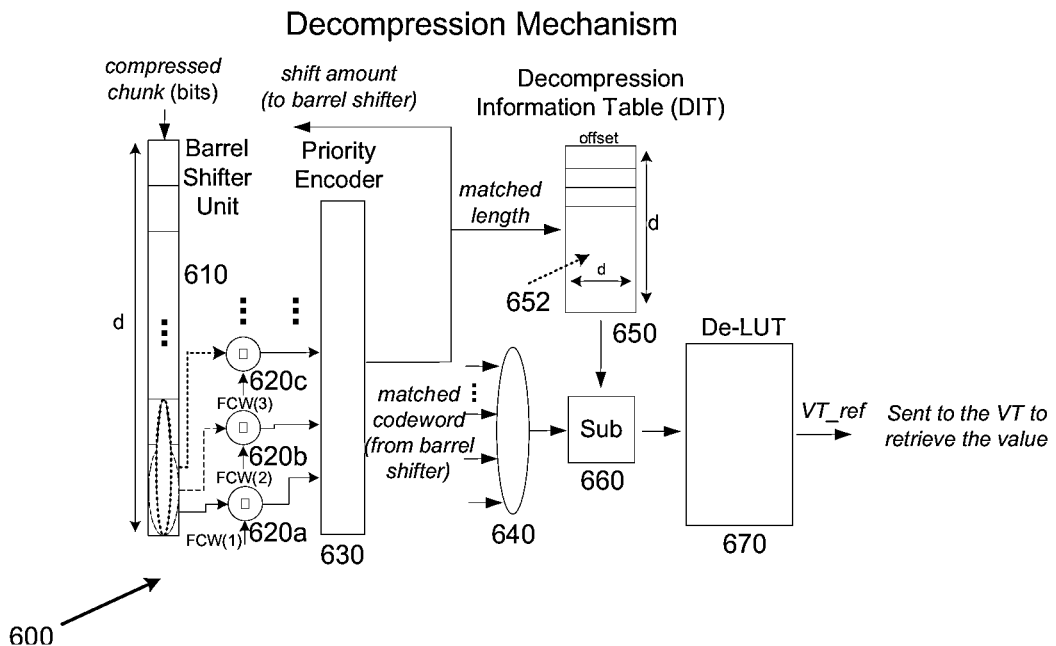
FIG. 6 depicts an embodiment of the decompression mechanism that is disclosed in this patent application. The decompression mechanism consists of several units and performs two operations: the code detection and the value retrieval. The code detection finds a valid codeword using the comparators 620 and the priority encoder 630, while the value retrieval operation uses the detected codeword to access a small table, the De-LUT 670 that contains the reference (VT_ref) of the Value Table (VT) location that contains the corresponding value. The DIT 650 contains information for the value retrieval operation.

FIG. 6 depicts an embodiment of a decompression mechanism HeDM 600 that has been adapted to make use of the Value Table to be applicable to the disclosed cache system disclosed in this patent application. The decompression mechanism decompresses the compressed data that, for example, have been requested by the processor. Decompressing a cache line can involve a number of issues. For example, it can be unknown where the word requested by a processor is located in a compressed cache line since any word can be represented by a variable-length Huffman codeword. In Huffman coding, a compressed symbol can be retrieved by traversing the Huffman tree using the codeword. Traversing the tree can be done fast and may have high throughput if it is implemented in hardware but a generic tree must be made in advance in order to support all the possible tree structures that may be constructed. Storing the tree, on the other hand, into the memory may be prohibitive since it may introduce overhead to store all the pointers of the intermediate nodes. An equally quick way with a potentially high throughput to retrieve a compressed value is by accessing a small table using the codeword as an index. A VT saves the values but codewords can be different than the VT indexing. Intermediate structures are needed. Thus, one embodiment of the decompression mechanism in the disclosed patent application makes use of the canonical Huffman coding (CHC) where the codewords have the numerical sequence property.

In CHC, codewords use consecutive binary numbers represented by a specific number of bits, determined by the length of the codeword known at code construction time. Codewords also preserve the prefix property of the original Huffman algorithm, while their corresponding values could be stored in consecutive locations of a table. Since the values are already saved in the VT, it would be more efficient to avoid replicating the tables and instead save the VT indexes of the values, in the consecutive locations of this table. During code construction, the code generation starts from the binary number 0 represented by 'x' bits, where 'x' is, say, the minimum code-word length, while the rest of the codewords of this length are consecutive binary numbers. Then, a codeword of the next length (l) is given by the formula: $C_l=2(C_{l-1}+1)$, where $C_{l-1}$ is the last assigned codeword of the previous length (l−1). The remaining codewords of this length (l) will be consecutive binary numbers. The code construction continues in this way until reaching the codewords with the maximum code-word length. The codeword lengths are defined by the original Huffman algorithm.

The canonical Huffman code generation is explained by way of an example. Assuming the 8 values a, b, c, d, e, f, g, h stored in the VT at locations 5, 3, 1, 0, 2, 7, 6, 4 with probabilities 0.05, 0.05, 0.05, 0.1, 0.15, 0.15, 0.2, 0.25 respectively, the original Huffman algorithm will generate the lengths of the code-words (that are associated with these values) which are: 4, 4, 4, 4, 3, 3, 2 and 2 respectively. Then the code construction algorithm will start from the most frequent one, from the right in the example and going to the left. Therefore, the value h will be assigned to the canonical codeword "00" whose numerical value is 0 represented by 2 bits as its codeword length is 2. Value g will then be assigned to "01". Value f must be replaced by a codeword of 3 bits. Using the formula above, since the last assigned code-word value was "01" to value g, value f will be assigned to the next numerical value that is codeword "10" shifted by one bit to the left "100" in order to be represented by 3 bits as the code length determines, while at the same time the prefix property is preserved. In a similar way, the canonical Huffman codewords for the above values are constructed and are respectively "1111", "1110", "1101", "1100", "101", "100", "01", "00". While this is one way of generating canonical codewords, there are alternative ways of generating canonical code-words depending on the code-word length the code generation algorithm starts with. In one alternative embodiment, the starting point could be the maximum codeword length (instead of the minimum), where the different codewords are created using a slightly different formula that is $C_l=(C_{l+1}+1)/2$.

Since the codewords are numerically consecutive binary numbers (and maintain the prefix property), their corresponding values can be also stored in consecutive locations of a small table (De-LUT 670) and be accessed by the canonical Huffman codeword instead of traversing a tree. However, in the current embodiment, the corresponding values already exist in the VT. Instead, referring to FIG. 6, an indirection table (De-LUT 670) is used where it saves the VT references of the corresponding values in consecutive locations. An additional issue is that the codewords of different lengths are not always strictly numerically consecutive, although the VT references of their corresponding values will be stored in consecutive locations. In the previous example, values h and g are stored in said locations 4 and 6 of the VT. These VT references (4 and 6) are stored in locations "(0)00" and "(0)01" respectively of the indirection table (De-LUT 670 at FIG. 6) and can be accessed by the associated codewords "00" and "01", respectively. However, the said VT location 7 of value f is stored in location "010" of the De-LUT 670, although the corresponding codeword to this value f is the "100". An offset of 2 must be subtracted from the codeword in order to obtain the proper De-LUT 670 index, which will provide the reference (VT_ref) to the VT. And the same offset must be subtracted from the codewords of the same length. In this way, the VT reference of value e, which is 2, is in the De-LUT 670 location "011" although the respective codeword is of value e is "101" (offset 2). Finally the VT references of values d, c, b, a that are 0, 1, 3 and 5 respectively are stored in the De-LUT 670 locations "100", "101", "110", "111" while the associated codewords to these values are "1100", "1101", "1110" and "1111" resulting in an offset of 8. The offset is calculated at code construction time and saved in a small table, for the future use during the compression phase. Note that the offset may be calculated in a different way if the coding is generated using an alternative method, for example starting from another code-word length, as it was previously explained. In one alternative embodiment, where the code-words are generated starting from the maximum code-word length, the offset is calculated in a similar way but it is positive, thus it is added instead of being subtracted. By using the canonical Huffman coding, decompression can be more efficient in terms of both storage and latency.

The decompression scheme comprises two independent operations: code detection and value retrieval. The first operation (code detection) aims at detecting a valid codeword. This is done by comparing the numerical value of all the possible bit sequences (up to the maximum codeword length) of the compressed data chunk to the numerical value of known codewords, such as the first codewords (FCW) of each codeword length. Since the codewords are built based on the numerical sequence property, a valid codeword of length, i.e., l will be valid if the numerical value of this codeword is larger or equal to the numerical value of the first codeword (FCW) of this length l and smaller than any codeword of length l+1 or larger. For every codeword length, the First CodeWord (FCW) is the codeword that was assigned to the first value of the group of codewords that have the same length, as it is emerged by the Huffman algorithm during the code construction. In the previous example, the FCW are the "00", "100" and "1100" for the codeword lengths 2, 3 and 4. The FCW is used in one embodiment of the invention disclosure in order to detect a valid codeword. In an alternative embodiment, the last codeword could have been used instead, but in combination with different comparison operation and priority selection. The second operation (value retrieval) of the decompression uses the outcome of the first operation to retrieves the VT reference that can be used to access the VT and retrieve the value that is associated with the respective detected codeword.

The embodiment of the decompression mechanism 600, referring back to FIG. 6, contains several subblocks. The Decompression LUT (De-LUT) 670 stores the VT references in consecutive locations as was previously explained. A VT reference is used to access the VT and retrieve the corresponding value. In an alternative embodiment, the values could be saved in the De-LUT straight ahead. However, this would result in a replication of resources to keep the same values, since the values are already saved in the VT. Replicating the VT may consume precious area and electrical energy overhead, especially if the VT size grows substantially. By saving references to the VT instead of values, the size of the indirection table De-LUT 670 is kept smaller than the VT, as it does not require saving the whole value, which can be of any granularity, e.g. 32 bits, but the VT index instead. If, for example, the VT grows from 2K entries to 4K entries, this will increase VT index (and the saved VT reference in the De-LUT 670) by only 1 bit. The indirection table De-LUT 670 has the same number of entries as the VT has, introducing a way of indirection. The De-LUT 670 is filled in with the VT references of the associated values during code construction after the codewords have been generated. Another important part of the decompression mechanism is the Decompression Information Table (DIT) 650 that keeps the information on how a valid codeword can be used to calculate the De-LUT index that will eventually provide the VT reference to retrieve its corresponding value. This information is the offset 652. The DIT 650 is filled in during the code construction and has as many entries as it is defined by the maximum codeword 'd'. In this embodiment, the offset of a particular length is subtracted from the codeword of that length to locate the correct index to the De-LUT 670 and retrieve the VT reference of the corresponding value.

In the embodiment of the decompression mechanism 600, depicted in FIG. 6 the decompression starts at the barrel shifter 610, the width of which is at least 'd' bits (the maximum codeword length), and inputs the compressed block. The compressed line can be also kept in a buffer to provide the bit sequence to the barrel shifter based on the shifting amount. Then, all the possible coding sequences are compared with the First CodeWords (FCWs) in the respective comparators 620a, 620b, etc., in order to detect a valid codeword as previously explained. In this way, the comparator 620a compares 1 bit, the comparator 620b two bits, the comparator 620c three bits and so on. Since it is possible that no codewords are generated for particular lengths, a valid bit is used and sent to the comparators 620 (620a, 620b, 620c, etc.) to cancel the comparison when there are non-existing codewords for particular lengths but other alternatives can be realized by someone skilled in the art. In addition, according to the numerical sequence property, it is expected that a valid codeword will be numerically larger than any numeric value of codewords of smaller lengths. Therefore, the largest detected codeword is the only valid one. This is the reason why the priority encoder 630 is needed.

By way of example, let's assume the following input "10100 . . . " in the barrel shifter and the codewords of the previous example. Every sequence of these input bits is sent to the comparators. The comparison is cancelled using the valid bit for the first bit since there are no codewords for one bit, while "10" is compared to the first codeword of length 2 that is "00" and similarly "101" is compared to "100", "1010" to "1100", etc. The 2-bit and 3-bit comparators give '1' while the 4-bit comparator gives obviously a '0' since a valid codeword of length 4 must be at least "1100". The 3-bit comparator's output is 1 since "101" is larger than "100". The 2-bit comparator's output is also 1, since it has larger numerical value than "00". However, "10" is not a valid codeword but a prefix of the valid codeword "101", thus a priority encoder can select the largest codeword match. In this embodiment, it is assumed that the FCWs are saved in registers to accelerate the loading of them. Someone skilled in the art will appreciate alternative embodiments.

When a valid codeword has been matched, the second operation (value retrieval) begins. The length of the matched codeword is used to access the DIT 650 to obtain the appropriate "offset", while the bits of the matched codeword are provided by the barrel shifter 610 and are concatenated in the unit 640. The index to the De-LUT 670 is found by subtracting the "offset" from the matched codeword and take as many least significant bits as needed to access the De-LUT 670. In an alternative embodiment, where the offset is positive, it would be added instead of being subtracted.

In this patent application, a number of methods and mechanisms that aim at faster decompression are contemplated and can be combined with the value-centric computer memory described.

A first approach to reduce the decompression latency as perceived by a CPU is to speculatively predict which the next cache access will be and use the prediction to start decompressing targeted compressed lines in advance. This approach, called pre-decompression, can be implemented by combining the ideas of compression with prefetching as known in prior art. The detection of the next cache access can be determined using the cache access pattern, in a similar way as typical hardware pre-fetching schemes, e.g., next-block prefetching or stride prefetching. For example, one can combine stride prefetching with decompression to decompress blocks before the content is needed so as to hide or tolerate the decompression latency. In another embodiment, one can combine sequential prefetching with the decompression mechanism to decompress a next block in the address space if a previous block is accessed. In yet another embodiment, one can use the information in a Load/Store Queue to predict future accesses. In contrast to prefetching, the prediction is used for the sole purpose of decompressing compressed cache blocks. Someone skilled in the art should be able to find other combinations of prefetching schemes including also software-based prefetching approaches (e.g., using dedicated prefetch instructions) and all such combinations are contemplated.

A second approach to reduce the decompression latency as perceived by a CPU is to use a small buffer to keep decompressed cache lines that have been recently requested by load and store requests. By only storing (decompressed) blocks in the buffer that are expected to be accessed again, e.g. combining the concepts of delinquent accesses known in prior art, the decompression latency can be avoided. To decide which blocks that should be buffered, one can for example inspect the LRU bits that are supported in caches using LRU replacement algorithms.

A third approach to reduce the decompression latency as perceived by a CPU builds on predictable access patterns, e.g., the first word in the cache line is the first to be accessed. By not decompressing the first word, the rest of the words can be decompressed in parallel with having the receiving the first word, thus resulting in a shorter access time as perceived by a CPU. The method and mechanisms needed to support this approach involves a number of heuristics as to which word is predicted to be the first one to be accessed. Access patterns from previous invocations of a specific block can be used to mark the word that was the first to be accessed in a particular block keeping that word uncompressed.

Recall that the embodiment of the value-centric memory described in this patent application operates either in a training phase or in a compression phase. When operating too long in the compression phase, the compressibility may go down and hence a new training phase can be needed. To improve the compressibility, a transition to the training phase is done when compressibility surpasses a first level and a transition from the training phase to the compression phase is done when the compressibility is higher than a second level, where the second level is higher than the first level. The first level is lower than a threshold, which is lower than the second level.

Figure 7:
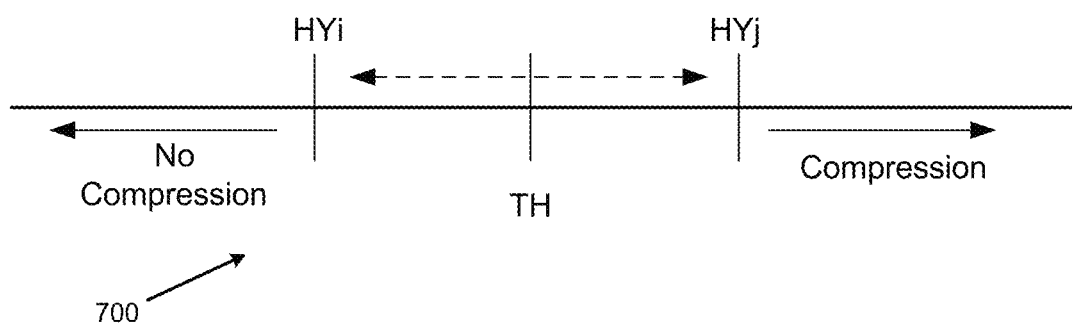
FIG. 7 depicts an example of how the adaptivity mechanism should make the decisions to activate the compression or not. In this figure, there is a threshold TH and two hysteresis points ($HY_i$ and $HY_j$) to prevent from quick decisions that may harm the performance of the system if the condition the decision is based on is slightly above or below the threshold.

FIG. 7 shows a mechanism for making decisions as to making a transition between the two operating modes: training and compression. In 700 $HY_i$ denotes the first level, $HY_j$ denotes the second level and TH denotes the threshold. When the compressibility is between the first and the second level no change in operating mode is done. A change is triggered either by the compressibility being lower than $HY_i$ or higher than $HY_j$.

It is also possible to let a computer system extended with a value-centric memory according to this patent application operate in the compression phase and at the same time keep up tracking the accessed values and updating the Value Table that is assumed to be on. In this mode of operation the system is still being trained and a new coding can be constructed if the current coding is evaluated not to be sufficient enough in the scenario discussed previously where the condition is below a certain hysteresis point but above the threshold. Of course, this requires at least two Value Tables so that one of them takes care of the verification that a valid codeword exists for a value while the other tracks the accessed values.

Apart from the specific structures needed to establish the value frequency in the training phase and compress values in the compression phase, certain changes to conventional cache memories are needed. A first change regards the tag array that known to someone skilled in the art establishes which blocks exist in the cache at anyone time. The tag array of the cache that uses the embodiment of the value-centric cache in this patent application must be also modified in order to support the area that is released due to compression. Extra tags are needed in order to store additional compressed blocks in the place of one uncompressed block. This may result in additional space overhead but a possible optimization is to use the property of sectored caches to group contiguous compressed cache lines in the place of one uncompressed by taking advantage of the spatial locality a running task may exhibit. The tag also contains extra information about the cache block, besides the conventional fields needed, e.g., coherence bits, replacement bits, dirty bits, etc. The extra information needed is to designate whether a cache block is compressed or not and if it is compressed, an address called block locator is included which points to the exact location in the data array. One can put restrictions on where to place a compressed block by considering several granularities. The finer the granularity is, the more information in the block locators is needed to locate a compressed block.

Another method needed regards code construction. The code construction can run in software or in hardware. The Huffman tree can be constructed using the heap data structure. A common operation of the heap is to discard the root of the tree and sort it again in $\log_2 N$, where N is the number of heap elements. Thus, starting by a min-heap data structure that contains all the values sorted according to their frequency of occurrence, the Huffman tree can be constructed in $O(N \log_2 N)$. The Huffman tree defines the length of the codewords that corresponds to the values of the value table. Canonical Huffman codewords can be generated using the formula described above and the previously generated lengths.

The embodiments disclosed in this patent application present systems, methods and mechanisms applied mainly to store information compactly in caches and how the access time overheads can be reduced. Alternatively, the invention disclosed can also be applied to any other level of the storage hierarchy including, e.g., main memory or secondary storage. Those skilled in the art will appreciate such alternatives. All such alternatives are contemplated.

What is claimed is:

1. A cache system for use with an electronic computer comprising one or a plurality of levels of a memory hierarchy wherein each level is configured to store data in one or a plurality of blocks, said cache system configured to, during system operation,
    (a) compressing data before storing and decompressing data when retrieving data:
    (b) monitoring, with regard to relative frequency of data values across all or a subset of locations in a cache, changes of data values as said data values are loaded into, modified, and evicted from the cache;
    (c) based on the monitoring in step (b) establishing the frequency of values as they occur in a cache;
    (d) forming codewords based on the frequency of values established in step (c);
    (e) using said codewords in the process of compressing values for storing in a cache;
    (f) based on a compression procedure of step (e) using said codewords in the process of decompressing values in a cache;
    (g) based on monitoring of the compressibility repeating step (a)-(f) when compressibility surpasses a pre-set threshold by re-establishing the relative frequency of data values in said cache in accordance with steps (b) and (c) and using said relative frequency in steps (d),(e), and (f) respectively.

2. The cache system as recited in claim 1 configured to include said first mechanism comprising means to determine how many times data values appear in one or a plurality of cache levels.

3. The cache system as recited in claim 2, wherein said first mechanism comprises one or a plurality of entries, wherein each entry comprises information of how many times said value appears.

4. The cache system as recited in claim 3, wherein an entry is selected by using all or partial information of a value as a key to select one or a plurality of entries; wherein said key is compared with a tag associated with each entry;
    wherein the entry is selected for which said key matches the tag, wherein each entry comprising a counter that keeps track of the number of times a specific value occurs, wherein said counter can be incremented and/or decremented.

5. The cache system as recited in claim 1 configured with a second mechanism that comprises a first structure to determine how many times values appear in said cache, a second structure comprising encodings of compressed said values.

6. The cache system as recited in claim 5, wherein the means to establish how many times values appear in said cache comprise said first structure comprising a plurality of entries, wherein each entry comprising how many times said values appear in said cache.

7. The cache system as recited in claim 6, wherein an entry is selected by using all or partial information of a value as a key to select one or a plurality of entries; wherein said key is compared with a tag associated with each entry;
    wherein the entry is selected for which said key matches the tag, wherein each entry comprising a counter that keeps track of the number of times a specific value occurs,
    wherein said counter can be incremented and/or decremented.

8. The cache system as recited in claim 5 wherein said second structure comprises one or a plurality of entries wherein each entry comprises a code and the length of that code.

9. The cache system as recited in claim 5 wherein the number of entries in the first structure and the second structure is the same and wherein a selected entry selected in said first structure selects the entry in said second structure and configured to output the a selected code.

10. The cache system as recited in claim 1 configured with a second mechanism comprising a first structure of values and a second structure comprising the encodings of compressed said values.

11. The cache system as recited in claim 10, wherein a first structure comprises one or a plurality of entries wherein each entry comprises a value, wherein an entry is selected by using all or partial information of a value as a key to select one or a plurality of entries, wherein said key is compared with a tag associated with each entry wherein the entry is selected for which said key matches the tag.

12. The cache system as recited in claim 11, wherein an entry in a second structure with the same number of entries is selected.

13. The cache system as recited in claim 12, wherein each entry in said second structure comprises a code and the length of the code and wherein said second structure can be configured to output a selected code and the length of that code.

14. The cache system as recited in claim 12, wherein each entry in said second structure comprises the number of times said values occur in said cache.

15. The cache system as recited in claim 1, wherein a third mechanism comprises a priority encoder to output the length of a compressed word.

16. The cache system as recited in claim 1, wherein a third mechanism outputs a reference to retrieve the compressed value, wherein the reference is an index to select one of a plurality of coded values.

17. The cache system as recited in claim 1, wherein a third mechanism is configured to respond to prefetching request, wherein prefetching requests decompress data before it is requested by a processing unit.

18. The cache system as recited in claim 1, wherein a third mechanism uses a structure with one or a plurality of entries in which decompressed blocks are temporarily stored.

19. The cache system as recited in claim 18 wherein said structure is indexed with one or a plurality of bits from an address to select an entry in said structure and wherein this structure is configured to output a selected decompressed block.

20. A method of operating a cache memory in an electronic computer during system operation, comprising the steps of
(a) compressing data before storing and decompressing data when retrieving data;
(b) monitoring, with regard to relative frequency, changes of data values as said data values are loaded into, modified, and evicted from the cache;
(c) based on the monitoring in step (b) establishing the frequency of values as they occur in a cache;
(d) forming codewords based on the frequency of values established in step (c);
(e) using said codewords in the process of compressing values for storing in a cache;
(f) based on a compression procedure of step (e) using said codewords in the process of decompressing values in a cache;
(g) based on monitoring of the compressibility repeating step (a)-(f) when compressibility surpasses a pre-set threshold by re-establishing the relative frequency of data values in said cache in accordance with steps (b) and (c) and using said relative frequency in steps (d), (e), and (f) respectively.

21. The method recited in claim 20 wherein the step (a) upon loading a block in a cache maintains the count of how many times each of a plurality of values in the loaded block appears; upon eviction of a block decrementing the count corresponding to each of the plurality of values in the evicted block; upon modifying one or a plurality of values in a block decrement the count of one or a plurality of modified values in a block as they appear before the modification and increment the count of the new values after modification.

22. The method recited in claim 20 wherein the step (b) sorts and the counts established in step (a) in ascending order to establish a sorted list of relative frequencies of values.

23. The method recited in claim 20, wherein the step (c) uses one or a plurality of counts associated with values in the cache in combination with statistical-based compression, e.g. Huffman coding, procedures to generate codewords and their lengths.

24. The method recited in claim 20, wherein the step (d) uses the code words and their respective lengths to decompress values contained in compressed blocks in a cache.

25. The method recited in claim 20, wherein the step (e) calculates the compressibility of blocks in a cache by dividing the number of blocks, compressed and uncompressed, stored in the cache with the number of uncompressed blocks that can be hosted in a cache and comparing that value to a preset threshold, wherein said threshold is a fraction of the measured compressibility when compression is enabled.

26. The method recited in claim 25, wherein if the calculated compressibility is below the threshold the cache system goes into a training phase in which steps (a)-(d) are repeated.

27. The method recited in claim 25, wherein if the calculated compressibility is above the threshold step (e) is repeated.

* * * * *